Figure 1:
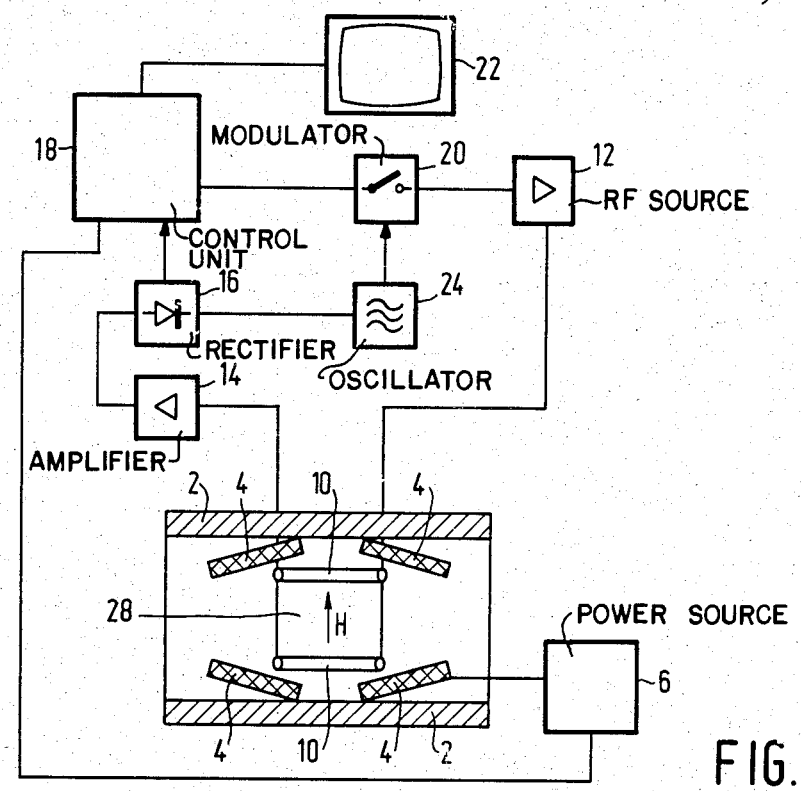

United States Patent [19]

Zijlstra

[11] Patent Number: 4,639,673
[45] Date of Patent: Jan. 27, 1987

[54] NUCLEAR MAGNETIC RESONANCE APPARATUS WITH A MAGNET OF PERMANENT MAGNETIC MATERIAL

[75] Inventor: Hinne Zijlstra, Eindhoven, Netherlands

[73] Assignee: U.S. Philips Corporation, New York, N.Y.

[21] Appl. No.: 662,651

[22] Filed: Oct. 19, 1984

[30] Foreign Application Priority Data

Jul. 17, 1984 [NL] Netherlands .......................... 8402249

[51] Int. Cl.⁴ .............................................. G01R 33/20
[52] U.S. Cl. .................................... 324/319; 335/306; 324/318
[58] Field of Search ............... 324/300, 307, 318, 319, 324/320, 322; 335/304, 306

[56] References Cited

U.S. PATENT DOCUMENTS 4,538,130  8/1985  Gluckstern ........................ 335/306
4,549,155 10/1985  Halbach .............................. 335/304

Primary Examiner—Michael J. Tokar
Attorney, Agent, or Firm—Robert T. Mayer; Algy Tamoshunas

[57] ABSTRACT

The disclosed nuclear magnetic resonance apparatus has a permanent magnet formed by laterally magnetized bars which are rotatable around their longitudinal axis. If the bars have a circular cross-section, all bars in the magnet system are identical and only the magnetization direction of each bar needs to be matched to the magnetization direction required at the relevant position. If the direction of magnetization in the system satisfies $\alpha = 2\phi$ at all times, where $\alpha$ is the magnetization direction and $\phi$ the polar coordinate of the relevant bar, efficient use is made of the magnetic material and, in contrast to other magnetization directions, it is possible to work without a return yoke.

13 Claims, 4 Drawing Figures

NUCLEAR MAGNETIC RESONANCE APPARATUS WITH A MAGNET OF PERMANENT MAGNETIC MATERIAL

The invention relates to a nuclear magnetic resonance apparatus with a system of magnets built up from permanent magnetic material for generating a homogeneous main magnetic field.

An apparatus of this type is known from the PCT patent application WO 84/01226.

A drawback of the apparatus described there is that the direction of magnetization of each of the blocks therein used must be exactly fixed since their position in the magnet system, apart from an axial adjustment facility, is completely fixed by the geometry of the blocks and the magnetic system. Only a slight change in the direction of magnetization of the individual blocks can cause a disturbing inhomogeneity in the main field.

The invention aims at overcoming this drawback, to which end a nuclear magnetic resonance apparatus of the kind mentioned in the preamble has the novel feature that the permanent magnetic material has the form of bars mounted in the magnet system so that their direction of magnetization can be adjusted after they are installed.

Proceeding from a substantially circular cylindrical measuring space, the permanent magnetic material will enclose a circular cylindrical space whose diameter and whose length, adjusted thereto, can still be freely chosen. In matched cylindrical coordinates whose z direction coincides with an axis of the cylindrical measuring space, it can then be calculated (with r and $\phi$ as further coordinates) that the radial field strength in a reference or x direction is maximum if, for the magnetization of the enclosing permanent magnetic material, the angle $\phi$ with the reference or X axis x axis satisfies the condition $\alpha = 2\phi$ for all directions, where $\alpha$ is the angle between the x axis and the magnetization direction. It also appears in this case that no field strength prevails in the y direction, perpendicular to the x direction. The strength of the field in the x direction in this case is inversely proportional to $\mu$, the magnetic permeability of the permanent magnetic material and inversely proportional to the square of the radius r of the enclosed cylindrical space.

In a preferred embodiment, the permanent magnetic material consists of a number of diametrically magnetized cylindrical bars which enclose a cylindrical measuring space. The bars are mounted in such a way that each is rotatable around an axis at right angles to the direction of magnetization of the bars. In particular, the bars are circular-cylindrical and the magnet system comprises, for example, 12 to 24 such bars. An advantage of using circular-shaped bars is that the magnetization can be identical for all bars, so that there is only one kind of magnetized bar for the entire magnet system.

In another preferred embodiment, the bars have a cross-section substantially in the form of a cylinder segment, for example, corresponding to the radial cross-section of the blocks indicated in PCT 84/01226, but are mounted in such a way that sufficient space is available for a certain rotation of each of the bars around its longitudinal axis.

In a further embodiment the magnet system contains more than one, for example two, layers of bars whereby for example bars situated more inwardly in the z direction have a central interruption and those situated more towards the outside cover that interruption and terminate at opposite sides at the same or different points as the inner bars.

In a further embodiment the bars are mounted in such a way that the direction of magnetization of the whole system is uniform in direction, for example for all bars parallel with the x direction. A jacket of material with a high magnetic permeability must then be fitted as a return yoke around the permanent magnetic system.

In a further embodiment the geometry of the bars, possibly with extra shim material or shim coils, provides a high degree of field homogeneity if desired, especially near an input side of the magnet.

Figure 2:
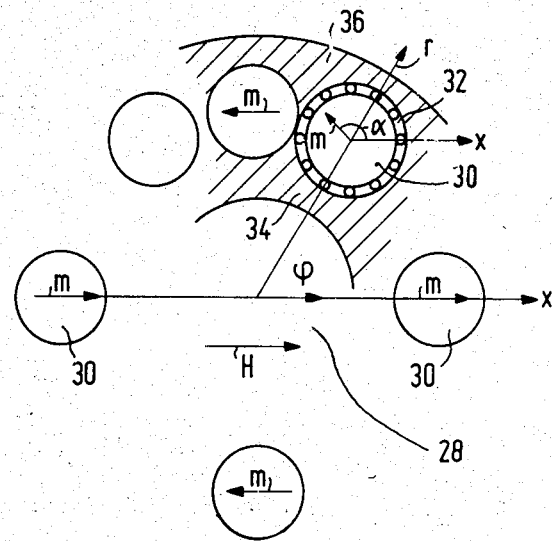
Figure 3:
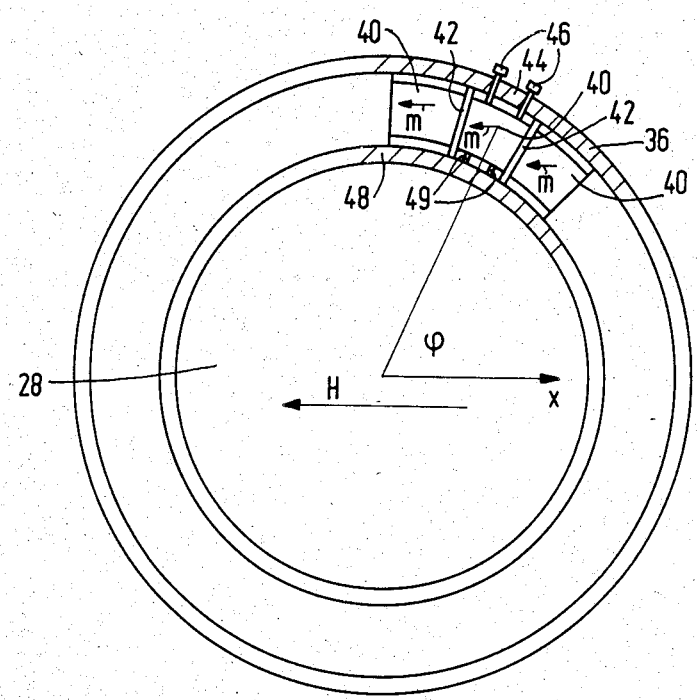
Figure 4:
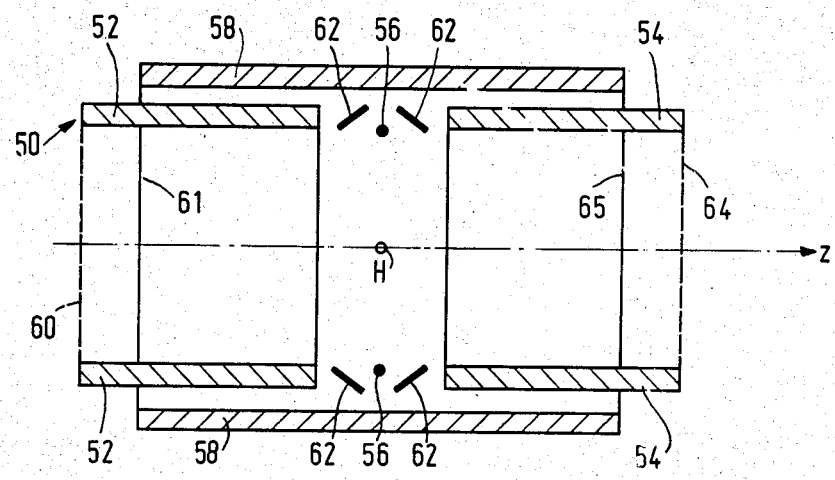

In the following some preferred embodiments in accordance with the invention will be described in more detail with reference to the drawings, in which:

FIG. 1 shows a nuclear magnetic resonance apparatus equipped with a permanent magnet, FIG. 2 shows a schematic cross-section of a circular cylindrical magnet with circular-cylindrical bars magnetised according to $\alpha = 2\phi$, FIG. 3 shows a permenent magnet composed of bars in the form of cylinder segments, FIG. 4 shows a similar system with two layers of bars mounted coaxially.

A nuclear magnetic resonance apparatus shown in FIG. 1 contains a permanent magnet system 2 for generating a stationary homogeneous magnetic field H, a magnet system 4 for generating magnetic gradient fields, and a power source 6 for the gradient coils 4. A magnet coil 10 generates a radio-frequency magnetic alternating field and accordingly is connected to a radio-frequency source 12. The coil 10 is also used for detecting nuclear magnetic resonance signals generated by the radio-frequency transmitting field in an object under examination. For that reason the radio-frequency coil 10 is also connected to a signal amplifier 14. The signal amplifier 14 is connected to a phase-sensitive rectifier 16 which is connected to a central control unit 18. The central control unit 18 also drives a modulator 20 for the radio-frequency source 12, the power source 6 for the gradient coils and a monitor 22 for image display. A high-frequency oscillator 24 drives both the modulator 20 and the phase-sensitive rectifier 16 which processes the measuring signals. The transmitting coil 10 placed within the magnet systems 2 and 4 encloses a measuring space 28 which, in an apparatus for medical diagnostic measurements, is large enough to accommodate patients. Thus, a homogeneous magnetic field H, gradient fields required for position selection of cross-sections to be displayed, and a spatially homogeneous radio-frequency alternating field are generated in the measuring space 28. For certain examinations, such as on more peripheral parts of the body and also for the spinal cord, it may be advantageous to use detection coils that can be adapted to the part of the body being examined. For example, surface coils may be used for localized examinations of the body such as the heart or spinal cord, or solenoid-type coils may be used for more peripheral parts of the body. In connection with the latter, mammary investigations are a particular case in point. These detection coils are then incorporated in the measuring space, where the transmitting coil can generate a locally homogeneous radio-frequency field. When a solenoid-type coil is used it can again combine the function of a transmitting coil and a measuring coil.

An embodiment of a permanent magnet in accordance with the invention, is shown in radial cross-section in FIG. 2. The magnet contains, in a circular-cylindrical geometry, an arrangement of circular-cylindrical bars 30 which enclose the measuring space 28 and which are magnetized in a direction m indicated by arrows. The bars consist of permanent magnetic materials such as ferrite, $SmCo_5$, $Sm(FeCoCuZr)_{7.5}$, $Nd_2Fe_{14}B$ or $Sm(CoCu)_5$. For so-called total body measurements, the measuring space has an inside diameter of, for example, approximately 1 m and a length of 1.5 to 2 m. The required quantity of magnetic material and, hence, the diameter of the bars, is dependent on the permanent magnetic material chosen, the number of bars and the required magnetic field strength in the measuring space. An optimally homogeneous magnetic field H in the measuring space is obtained if the direction of magnetization m of the permanent magnetic material satisfies at all times the condition $\alpha=2\phi$, where $\phi$ is the angle between the x axis and the radius r towards a relevant bar 30 and $\alpha$ is the angle between the x axis and the direction of magnetization m. As indicated in the figure, the direction of the magnetization thus changes with an angular rate which is twice the angular rate $\phi$ of the direction of the radius. Inside the cylinder, a magnetic field H is thus generated which, when shim material is used, is sufficiently homogeneous in a relatively large part of the enclosed space. The permanent magnetic material preferably has, in addition to a high magnetization for achieving a relatively high field H with relatively little material, a low temperature coefficient for the magnetization in order to keep the field stable with changing temperature, and good spatial homogeneity, a high coercivity in order to shield the magnetization against external fields, and a high field anisotropy to avoid local disturbances of the magnetization.

Each of the bars 30 is incorporated in a holder 32 which in turn is incorporated in an inner carrier or housing 34, which must not influence the magnetic field, and an outer carrier or housing 36 which may for example form part of a shield, in particular a magnetic shield, but which for this geometry of magnetization is not strictly necessary. The bar 30 can be rotated in the holder 32 and in this way the homogeneity of the magnetic field H can be optimised. If required, the holder 32 can also be mounted in the housing combination 34-36 in such a way that the bar is radially displaceable with the holder 32 and can thus be post-adjusted. Since all bars here are identical, there will not however be much need for this. The bars can be magnetized in the form in which they are to be used, but it is also possible to take for example magnetized rectangular bars and then subsequently give them the required shape. To make this operation simpler, the cross-section of the bars can also have the shape of a regular polygon. The bars can then also be incorporated in holders such as the holder 32 whose inside diameter then forms an enclosing circle for the bar. The number of bars depends on the degree of homogeneity desired and is, for example, 12 to 24.

In complete correspondence, it is also possible to use a homogeneously magnetized system, that is to say one in which the direction of the magnetization is mutually parallel for all bars, for example, parallel to the x axis in FIG. 2. A disadvantage of such a system is that from the magnetic viewpoint, it does not form a closed system but has a partly external return field which compensates the required field and could give rise to a stray field. As already remarked, this can be overcome by means of a soft magnetic shield. As such, the bars can be identical to those of the system described earlier. Bars magnetized in accordance with the invention can be used in both systems. Apart from the shield, it is thus possible simply by rotating the bars to convert one system into the other. The post assembly alignment of the bars can be performed completely empirically. It is also possible to measure the influence of the magnetization direction of each of bar on the homogeneity of the field and from those data to compose an algorithm for the alignment of each of the bars. From considerations of symmetry this will preferably be done in pairs, i.e. with pairs of bars diametrically mounted in the system. The influence of each of the bars or of each pair of bars can be calculated. It can also be determined empirically given a known rotation by measuring the influence on the field in the measuring space.

A more compact structure of permanent magnetic material is obtained when, as indicated in FIG. 3, the lateral cross-section of all bars is given a cylinder-segment shaped cross-section matched to the required geometry. Bars 40 with such a cross-section are again arranged to form a magnet system with a measuring space 28. Openings 42 between the bars allow rotation here too, although the amount of rotation is limited. For the setting to optimum homogeneity of the field, the space 42 does not have to be large since the direction of magnetization of each of the bars can be reasonably accurate. The setting can be obtained, for example, by mounting the bars in a carrier or housing 44 which is provided with adjusting screws 46 and possibly with a carrier or housing 48 which is fitted with spring elements 49, for example of sufficiently ductile material. The practical advantage that all bars are mutually identical and interchangeable is dropped in this case. Since, owing to the post assembly alignment of the direction of magnetization, the magnetic field can be given a higher order of homogeneity, it will be advantageous to apply more than the eight elements mentioned in WO 84/01226. Here too, depending on the geometry and the desired homogeneity, 12 to 24 bars are recommended. In a completely analogous way, one can work here too with a system magnetized according to $\alpha=2\phi$ or a system with homogeneous magnetization. Here, of course, the systems are not mutually convertible and a return yoke is again required for the latter configuration.

Up to now a single layer has been considered. An embodiment illustrated in longitudinal section in FIG. 4 shows two layers of bars. A first or inner layer 50 consists of two parts 52 and 54 with a spacing 56 and a second or outer layer 58 which here consists of bars without a spacing. Each of the systems 52, 54 and 58 is built up in the same way as the systems described earlier. With such a system, a magnet can be formed whose field H, also for example, near an end face 60 of the magnet, is sufficiently homogeneous for diagnostic measurements. The geometry, in particular the relative position of the end face 60 of an inner layer and an end plane 61 of the outer layer and the size of the interruption 56, can be optimized for homogenizing the magnetic field near the end plane 60. For this purpose extra magnetic material or an additive magnet coil can be added. A magnet with a magnetic field of good homogeneity near an end face is particularly suitable for breast examinations, for example. The diameter of the magnet and hence the whole dimension and its total weight can be significantly reduced with a magnet specifically meant for this purpose. A diameter of 15 to 20 cm is then sufficient. When a solenoid is used as the transmitting-measuring coil, the result is a cheap, easily operated nuclear magnetic resonance apparatus which requires no energy for the main field. The diameter of the magnet can be further limited with a design such that a gradient coil system 62 can be incorporated in the space 56. From symmetry considerations such a magnet is in principle capable of two-sided use. Since, given a proper construction, the field at an end face 64 is identical with the field at the end face 60, one of the ends of the magnet can also be used as a reference, for example with a dummy object, enabling corrections to be made for systematic field inhomogeneities. If the mutual position of the end faces of the two layers is made unequal at both ends of the magnet, the magnet can be made asymmetric. The magnetic field near each of the ends can then be matched to a specific application.

What is claimed is:

1. A nuclear magnetic resonance apparatus comprising a system of magnets for generating a homogeneous main magnetic field in a measuring space, said system comprising a plurality of permanent magnets in the form of elongated bars made of permanent magnetic material, a housing for supporting said bars so that said bars are arranged about said measuring space, and means for mounting at least one of said bars in said housing for movement with respect to said housing and with respect to another of said bars so as to enable the direction of magnetization of said at least one bar to be changed with respect to the direction of magnetization of said another bar to thereby adjust said magnetic field in said measuring space after installation of said bars in said housing.

2. A nuclear magnetic resonance apparatus as claimed in claim 1 wherein said measuring space is elongated and said bars are arranged about said measuring space with the longitudinal axes thereof generally parallel to the longitudinal axis of said measuring space.

3. A nuclear magnetic resonance apparatus as claimed in claim 2 wherein said bars are magnetized such that the direction of magnetization is generally perpendicular to the direction of the longitudinal axis of the respective bar.

4. A nuclear magnetic resonance apparatus as claimed in claim 1, 2 or 3 wherein said at least one bar is mounted for rotation about an axis which is perpendicular to the direction of magnetization thereof.

5. A nuclear magnetic resonance apparatus according to claim 2 wherein said measuring space is cylindrical and said bars are magnetized in a direction transverse to the longitudinal axes thereof and said bars are arranged with an orientation such that the angle between the direction of magnetization of a given bar and a fixed, reference direction which is perpendicular to the longitudinal axis of said cylindrical measuring space is always twice the angle between a reference axis, which is parallel to said reference direction and intersects the longitudinal axis of said measurement space at an intersection point, and a radial line extending from said intersection point to the center of said given bar.

6. Nuclear magnetic resonance apparatus as claimed in claim 5 wherein said bars are cylindrical and are mounted for rotation about the longitudinal axes thereof.

7. A nuclear magnetic resonance apparatus as claimed in claim 1 or 2 wherein said system includes an inner layer comprised of said bars arranged about said measuring space and an outer layer comprised of said bars which are spaced outwardly from said bars of said inner layer with respect to the longitudinal axis of said measuring space and arranged about said bars of said inner layer so as to form two spaced apart layers of said bars about said measuring space.

8. A nuclear magnetic resonance apparatus as claimed in claim 7 wherein one of said inner and outer layers comprises a first plurality of said bars and a second plurality of said bars, the longitudinal axes of said bars of said first and second plurality being generally parallel to the longitudinal axis of said measuring space and said bars of said first and second plurality being spaced substantially a uniform distance from the longitudinal axis of said measuring space and wherein said bars of said first plurality are spaced from said bars of said second plurality in a direction parallel to the longitudinal axes thereof so as to form a gap therebetween.

9. A nuclear magnetic resonance apparatus as claimed in claim 8 wherein said inner layer is comprised of said first and second plurality of said bars with said gap therebetween and wherein said bars of said outer layer extend about said gap.

10. A nuclear magnetic resonance apparatus as claimed in claim 1 including means for homogenizing the magnetic field at the axial ends of said measuring space.

11. Nuclear magnetic resonance apparatus as claimed in claim 1 or 2 in which the bars of the permanent magnetic material have a uniform direction of magnetization with respect to the longitudinal axis of the respective bars.

12. Nuclear magnetic resonance apparatus as claimed in claim 1, in which the bars (30) have a circular cross-section.

13. Nuclear magnetic resonance apparatus as claimed in claim 8, in which the measuring space has a diameter of about 20 cm near at least one of the ends.

* * * * *